United States Patent
Baghdasarian

(10) Patent No.: US 11,912,440 B2
(45) Date of Patent: Feb. 27, 2024

(54) PARTIALLY FLEXIBLE SOLAR ARRAY STRUCTURE

(71) Applicant: Maxar Space LLC, Palo Alto, CA (US)

(72) Inventor: Varouj Baghdasarian, Cupertino, CA (US)

(73) Assignee: Maxar Space LLC, Palo Alto, CA (US)

( * ) Notice: Subject to any disclaimer, the term of this patent is extended or adjusted under 35 U.S.C. 154(b) by 336 days.

(21) Appl. No.: 17/463,670

(22) Filed: Sep. 1, 2021

(65) Prior Publication Data
US 2023/0064039 A1    Mar. 2, 2023

(51) Int. Cl.
*B64G 1/44* (2006.01)
*H01L 31/041* (2014.01)
*H02S 30/20* (2014.01)

(52) U.S. Cl.
CPC .......... *B64G 1/443* (2013.01); *H01L 31/041* (2014.12); *H02S 30/20* (2014.12)

(58) Field of Classification Search
CPC .......... H02S 30/00; H02S 30/10; H02S 30/20; B64G 1/222; B64G 1/2222; B64G 1/2228; B64G 1/44; B64G 1/443; B64G 1/446
See application file for complete search history.

(56) References Cited

U.S. PATENT DOCUMENTS

| | | | | |
|---|---|---|---|---|
| 3,326,497 A | * | 6/1967 | Michelson | B64G 1/443 343/705 |
| 3,544,041 A | * | 12/1970 | Billerbeck, Jr. | B64G 1/443 244/172.6 |
| 3,620,846 A | * | 11/1971 | Paine et al. | B64G 1/222 244/172.6 |
| 3,690,080 A | * | 9/1972 | Dillard | B64G 1/443 244/172.6 |
| 3,722,840 A | * | 3/1973 | Andrews | B64G 1/222 244/172.6 |
| 3,735,943 A | * | 5/1973 | Fayet | H02S 30/20 244/172.7 |

(Continued)

FOREIGN PATENT DOCUMENTS

| | | | | |
|---|---|---|---|---|
| EP | | 754625 B1 * | 6/2000 | B64G 1/222 |
| EP | | 1043228 A2 * | 10/2000 | B64G 1/222 |
| WO | WO-0034123 A1 * | | 6/2000 | B64G 1/222 |

*Primary Examiner* — Richard Green
*Assistant Examiner* — Michael A. Fabula
(74) *Attorney, Agent, or Firm* — Vierra Magen Marcus LLP

(57) ABSTRACT

A solar array structure, such as for a spacecraft, uses thin solar array panels that, when in a stowed configuration, are stiffened by being bent or curved in one direction to be shaped like a section of a cylinder and placed within a rigid structural frame. As a curved solar panel is not as efficient as a flat panel directly facing the sun, the solar array panels are curved in their stowed configuration for launch only, but flatten after deployment by use of a partially flexible structural frame, where a rectangular frame is made of two opposing rigid sides and two opposing flexible sides, with a thin flexible solar panel attached to rigid sides only. The rigid sides are compressed during stowage to curve the panel before hold-down tensioning. The structure and panels return to their flat free state configuration after release.

20 Claims, 9 Drawing Sheets

(56) References Cited

U.S. PATENT DOCUMENTS

| | | | |
|---|---|---|---|
| 3,785,590 A * | 1/1974 | Wentworth | B64G 1/443 160/245 |
| 3,817,481 A * | 6/1974 | Berks | B64G 1/222 244/172.7 |
| 3,863,870 A * | 2/1975 | Andrews | B64G 1/443 244/172.6 |
| 4,133,501 A * | 1/1979 | Pentlicki | B64G 1/443 244/172.6 |
| 4,787,580 A * | 11/1988 | Ganssle | B64G 1/222 244/172.6 |
| 5,244,508 A * | 9/1993 | Colozza | B64G 1/222 136/292 |
| 5,496,414 A * | 3/1996 | Harvey | F24S 23/31 136/246 |
| 5,785,280 A | 7/1998 | Baghdasarian | |
| 5,833,176 A * | 11/1998 | Rubin | B64G 1/222 244/172.7 |
| 6,343,442 B1 * | 2/2002 | Marks | B64G 1/222 244/172.6 |
| 6,423,895 B1 * | 7/2002 | Murphy | H02S 30/20 136/245 |
| 6,637,702 B1 | 10/2003 | McCandless | |
| 8,616,502 B1 * | 12/2013 | Stribling | B64G 1/222 244/172.6 |
| 8,636,253 B1 * | 1/2014 | Spence | H02S 30/20 244/172.8 |
| 8,683,755 B1 * | 4/2014 | Spence | B64G 1/222 52/173.3 |
| 8,893,442 B1 | 11/2014 | Spence et al. | |
| 8,894,017 B1 * | 11/2014 | Baghdasarian | B64G 1/44 244/172.6 |
| 9,120,583 B1 * | 9/2015 | Spence | B64G 1/222 |
| 9,156,568 B1 * | 10/2015 | Spence | B64G 1/44 |
| 9,346,566 B2 | 5/2016 | Spence et al. | |
| 9,444,004 B1 | 9/2016 | Spence et al. | |
| 9,450,131 B1 | 9/2016 | Spence et al. | |
| 9,580,190 B1 | 2/2017 | Spence et al. | |
| 9,604,737 B2 | 3/2017 | Spence et al. | |
| 9,611,056 B1 * | 4/2017 | Spence | B64G 1/222 |
| 9,620,658 B1 | 4/2017 | Spence et al. | |
| 9,676,501 B1 | 6/2017 | Spence et al. | |
| 9,899,559 B2 | 2/2018 | Spence et al. | |
| 10,189,582 B1 | 1/2019 | Spence et al. | |
| 10,239,642 B1 * | 3/2019 | Spence | H02S 30/20 |
| 2002/0040726 A1 * | 4/2002 | Roth | H02S 30/20 136/291 |
| 2003/0000569 A1 * | 1/2003 | Zwanenburg | B64G 1/222 136/251 |
| 2012/0090660 A1 * | 4/2012 | Keller | H02S 20/30 52/645 |
| 2014/0263847 A1 * | 9/2014 | Eskenazi | B64G 1/44 244/172.6 |
| 2015/0144740 A1 * | 5/2015 | Turse | B64G 1/44 244/172.6 |
| 2016/0122041 A1 * | 5/2016 | Abrams | B64G 1/443 244/172.6 |
| 2016/0137319 A1 * | 5/2016 | Steele | B64G 1/66 52/745.2 |
| 2016/0159500 A1 * | 6/2016 | Marks | B64G 1/443 244/172.6 |
| 2016/0332752 A1 * | 11/2016 | Abrams | B64G 1/222 |
| 2017/0081046 A1 | 3/2017 | Spence et al. | |
| 2017/0297749 A1 * | 10/2017 | Steele | B64G 1/222 |
| 2022/0321057 A1 * | 10/2022 | Mazor | B64G 1/44 |
| 2022/0363414 A1 * | 11/2022 | Harvey | B64G 1/443 |
| 2023/0046563 A1 * | 2/2023 | Baghdasarian | H02S 20/30 |
| 2023/0050780 A1 * | 2/2023 | Baghdasarian | H02S 30/10 |

* cited by examiner

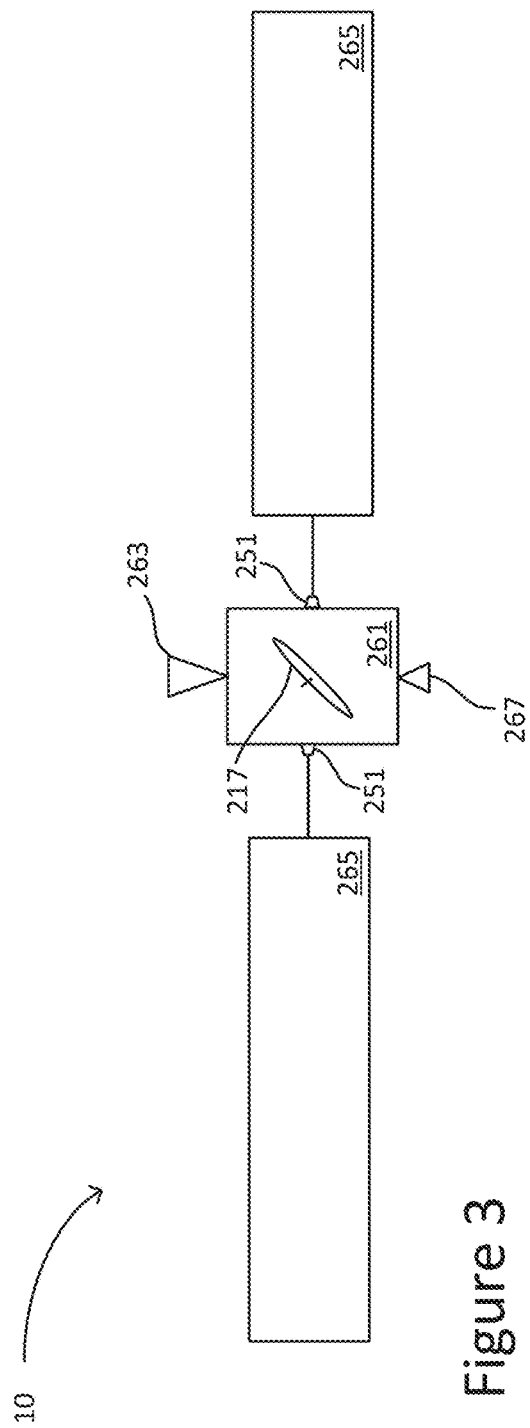
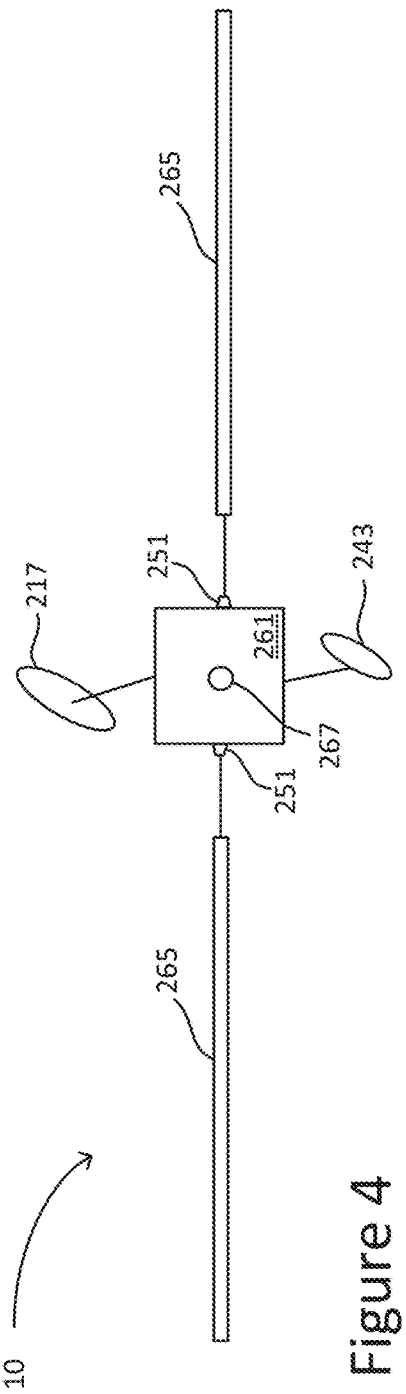

PARTIALLY FLEXIBLE SOLAR ARRAY STRUCTURE

BACKGROUND

To provide operating power, satellites use solar array structures with a large surface area of photovoltaic cells to generate electricity from the sunlight incident on the array structure. For shipment and launch the solar array is stowed to have a small volume and then deployed once the spacecraft has been launched. For launch purposes, the smaller the volume and the lower the weight, the better. Once fully deployed, it is desirable that the solar array structure provide a light weight, stiff, strong, stable, and flat surface of sufficient surface area that can allow uniform exposure to the sun and minimize on-orbit spacecraft attitude control disturbance while meeting the satellite's power requirements. These conflicting needs result in an ongoing pursuit of improvements in the design of such solar arrays.

BRIEF DESCRIPTION OF THE DRAWINGS

FIGS. 3 and 4 illustrate two views of a spacecraft with deployed solar arrays.

DETAILED DESCRIPTION

Aside from those using flexible blanket solar arrays, most solar array structures consist of a yoke and few rigid solar panels, typically made of laminated honeycomb composite. The rigidity of the panels is required to provide strength and stiffness to survive launch loads. Another approach is to use structural frames with thinner panels, but to then use multiple spacers (or snubbers or ribs) to support thin panels in the out-of-plane direction during launch. The following discussion presents embodiments based on an alternate approach that uses lightweight, thin solar array panels, but avoids the added weight of spacers or ribs that would otherwise be needed to provide the required stiffness during launch.

More specifically, embodiments presented below use thin solar array panels that, when in a stowed configuration, are stiffened by being bent or curved in one direction to be shaped like a section of a cylinder and placed within a rigid structural frame. However, as a curved solar panel is not as efficient as a flat panel directly facing the sun, the solar array panels are curved in their stowed configuration for launch only, but flatten after deployment. This is accomplished by use of a partially flexible structural frame, where a rectangular frame is made of two opposing rigid sides and two opposing flexible sides with a thin flexible solar panel attached to rigid sides only. The rigid sides are compressed during stowage to curve the panel before hold-down tensioning. The structure and panels return to their flat free state configuration after release.

Figure 1:
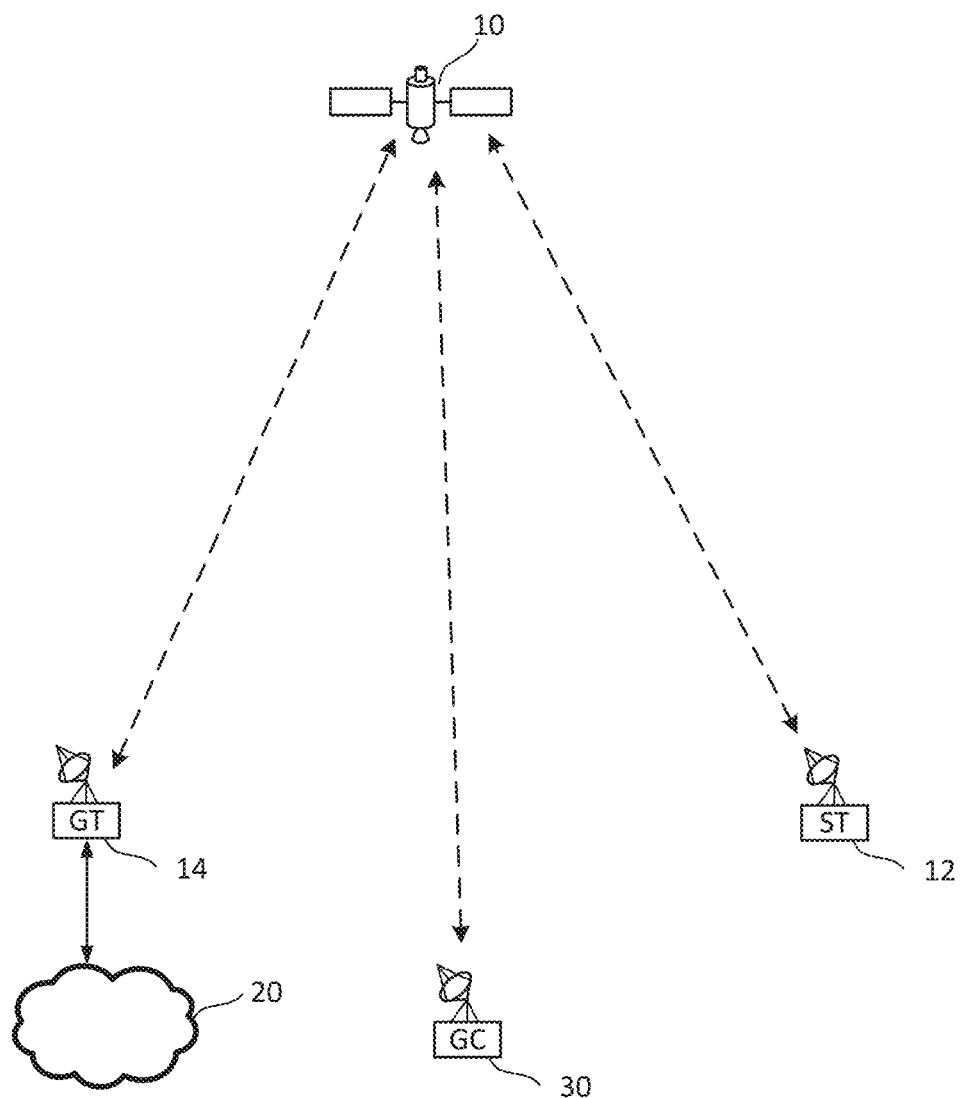
FIG. 1 is a block diagram of a spacecraft system.

FIG. 1 is a block diagram of a spacecraft system that can implement the technology proposed herein. The system of FIG. 1 includes spacecraft 10, subscriber terminal 12, gateway 14, and ground control terminal 30. Subscriber terminal 12, gateway 14, and ground control terminal 30 are examples of ground terminals. In one embodiment, spacecraft 10 is a satellite; however, spacecraft 10 can be other types of spacecrafts (e.g., shuttle, space station, inter-planet traveling craft, rocket, etc.). Spacecraft 10 may be located, for example, at a geostationary or non-geostationary orbital location. Spacecraft 10 can also be a Low Earth Orbit satellite. Spacecraft 10 is communicatively coupled by at least one wireless feeder link to at least one gateway terminal 12 and by at least one wireless user link to a plurality of subscriber terminals (e.g., subscriber terminal 12) via an antenna system. Gateway terminal 14 is connected to the Internet 20. The system allows spacecraft 10 to provide internet connectivity to a plurality of subscriber terminals (e.g., subscriber terminal 12) via gateway 14. Ground control terminal 30 is used to monitor and control operations of spacecraft 10. Spacecraft can vary greatly in size, structure, usage, and power requirements, but when reference is made to a specific embodiment for the spacecraft 10, the example of a communication satellite will often be used in the following, although the techniques are more widely applicable, including other or additional payloads such as for an optical satellite.

Figure 2:
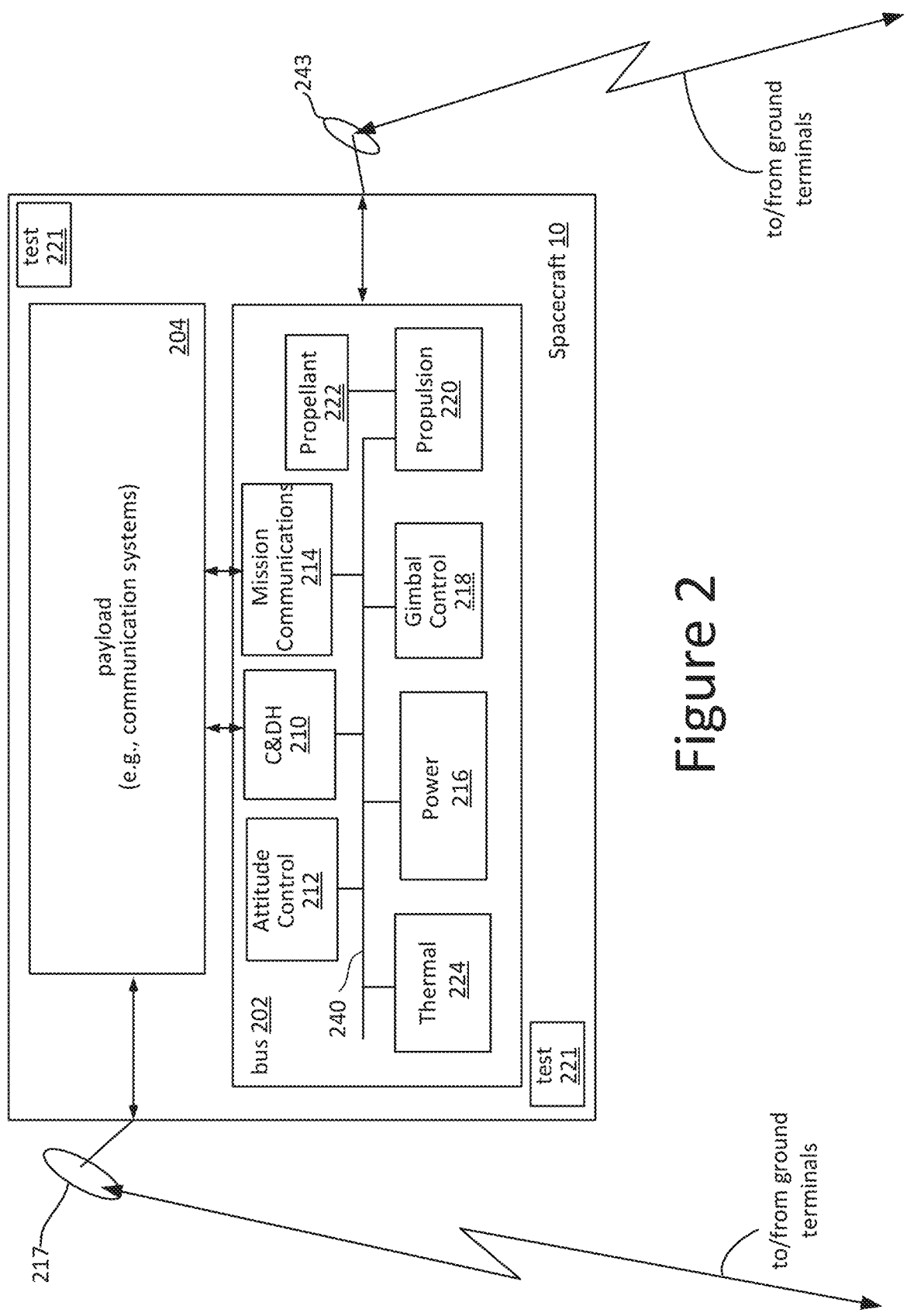
FIG. 2 is a block diagram of an example spacecraft.

FIG. 2 is a block diagram of one embodiment of spacecraft 10, which in one example (as discussed above) is a satellite. In one embodiment, spacecraft 10 includes a bus 202 and a payload 204 carried by bus 202. Some embodiments of spacecraft 10 may include more than one payload. The payload provides the functionality of communication, sensors and/or processing systems needed for the mission of spacecraft 10.

In general, bus 202 is the spacecraft that houses and carries the payload 204, such as the components for operation as a communication satellite. The bus 202 includes a number of different functional sub-systems or modules, some examples of which are shown. Each of the functional sub-systems typically include electrical systems, as well as mechanical components (e.g., servos, actuators) controlled by the electrical systems. These include a command and data handling sub-system (C&DH) 210, attitude control systems 212, mission communication systems 214, power subsystems 216, gimbal control electronics 218 that be taken to include a solar array drive assembly, a propulsion system 220 (e.g., thrusters), propellant 222 to fuel some embodiments of propulsion system 220, and thermal control subsystem 224, all of which are connected by an internal communication network 240, which can be an electrical bus (a "flight harness") or other means for electronic, optical or RF communication when spacecraft is in operation. Also represented are an antenna 243, that is one of one or more antennae used by the mission communication systems 214 for exchanging communications for operating of the spacecraft with ground terminals, and a payload antenna 217, that is one of one or more antennae used by the payload 204 for exchanging communications with ground terminals, such as the antennae used by a communication satellite embodiment. The spacecraft can also include a number of test sensors 221, such as accelerometers that can used when performing test operations on the spacecraft. Other equipment can also be included.

The command and data handling module 210 includes any processing unit or units for handling includes command control functions for spacecraft 10, such as for attitude control functionality and orbit control functionality. The attitude control systems 212 can include devices including torque rods, wheel drive electronics, and control momentum gyro control electronics, for example, that are used to monitor and control the attitude of the space craft. Mission communication systems 214 includes wireless communication and processing equipment for receiving telemetry data/commands, other commands from the ground control terminal 30 to the spacecraft and ranging to operate the spacecraft. Processing capability within the command and data handling module 210 is used to control and operate spacecraft 10. An operator on the ground can control spacecraft 10 by sending commands via ground control terminal 30 to mission communication systems 214 to be executed by processors within command and data handling module 210. In one embodiment, command and data handling module 210 and mission communication system 214 are in communication with payload 204. In some example implementations, bus 202 includes one or more antennae as indicated at 243 connected to mission communication system 214 for wirelessly communicating between ground control terminal 30 and mission communication system 214. Power subsystems 216 can include one or more solar panels and charge storage (e.g., one or more batteries) used to provide power to spacecraft 10. Propulsion system 220 (e.g., thrusters) is used for changing the position or orientation of spacecraft 10 while in space to move into orbit, to change orbit or to move to a different location in space. The gimbal control electronics 218 can be used to move and align the antennae, solar panels, and other external extensions of the spacecraft 10.

In one embodiment, the payload 204 is for a communication satellite and includes an antenna system (represented by the antenna 217) that provides a set of one or more beams (e.g., spot beams) comprising a beam pattern used to receive wireless signals from ground stations and/or other spacecraft, and to send wireless signals to ground stations and/or other spacecraft. In some implementations, mission communication system 214 acts as an interface that uses the antennae of payload 204 to wirelessly communicate with ground control terminal 30. In other embodiments, the payload could alternately or additionally include an optical payload, such as one or more telescopes or imaging systems along with their control systems, which can also include RF communications to provide uplink/downlink capabilities.

FIGS. 3 and 4 look an exterior view for an embodiment of spacecraft 10 in more detail. More specifically, FIGS. 3 and 4 show two views of an embodiment of spacecraft 10, where FIG. 4 shows the spacecraft rotated by 90° about the axis of the solar arrays 265 relative to FIG. 3. A number of different embodiments are possible, but the example of FIGS. 3 and 4 can be used to illustrate some of the elements relevant to the current discussion.

Referring to FIGS. 3 and 4, the spacecraft 10 includes a spacecraft body 261 from which extend two, in this example, deployed solar arrays 265. Attached to the body will also be one or more number of antennae 217 and 243 as described above, by which the satellite can receive and transmit signals. Depending on the particulars of the embodiment, a satellite may have a large number of antennae, but only a pair of antennae for exchanging signals with a ground station are shown. Attached to the spacecraft body 261 are a number of thrusters, as shown at 263 and 267, which typically include one or more main thrusters and a number of attitude and orbit control thrusters. Internal to the body will be the spacecraft's frame (not show) within which the functional sub-systems can be installed.

The deployed arrays 265 can include a solar array, a thermal radiating array, or both and include one or more respectively coplanar panels. The deployed arrays 265 can be rotatable by the gimbal control or solar array drive assembly 251 about the longitudinal axis (the left-right axis in FIGS. 3 and 4), in order to achieve or maintain a desired attitude with respect to, for example, the sun. For embodiments in which the deployed arrays 265 include a solar array, the solar array may be articulable so as to be substantially sun facing and electrically connected to the spacecraft 10 to provide power. The deployed solar array 265 may be sized and positioned so as to generate substantially more power from sunlight than would be possible if the solar array was fixedly disposed on the body 261 of the spacecraft 10. For example, in some implementations, the solar array orientation may be rotatable about the longitudinal axis of the spacecraft 10 so that photovoltaic power generating surfaces of the solar array remains substantially sun facing. For shipping and launching of the spacecraft 10, the solar array is stowed into a small volume. Although the stowed volume is wanted to be as small as practicable, the solar array will also need to be large enough to provide sufficient power for spacecraft operations once deployed.

Aside from flexible blanket type solar arrays, most solar arrays consist of a yoke and few rigid panels, typically made of laminated honeycomb composite. The rigidity of the panels is used to provide the strength and stiffness to survive launch loads. Another approach is to use structural frames with thinner panels combined with multiple spacers (or snubbers or ribs) to support thin panels in the out-of-plane direction during launch. The following discussion presents techniques that can stiffen thin solar array panels during launch without the use of spacers or ribs, resulting in a lightweight deployable solar array structure. To stiffen thin solar array panels, embodiments presented below can bend or curve the panels in one direction, to make them like sections of a cylinder, and place them inside of rigid structural frames. However, since a curved solar panel is not as efficient as a flat panel directly facing the sun, the panels are curved for launch only, but flatten after deployment. This is accomplished by use of partial-flex structural frame, where a rectangular frame is made of two opposing rigid sides and two opposing flexible sides with a thin flexible solar panel attached to rigid sides only. The rigid sides are compressed during stowage to curve the panel before hold-down tensioning. The structure and panels return to their flat free state configuration during deployment after release.

More specifically, the following presents embodiments for a solar array structure using a rectangular structural frame with two opposing rigid axial sides and two opposing flexible cross members. The frame is flat with straight cross members in its free state. The opposing flexible cross members bow outward (or inward), allowing rigid members to get closer to each other when forced. A thin flat solar array panel, or a composite laminate skin, would be flexibly attached to rigid sides of the frame, but not the flexible sides. Forcing the rigid sides of the frame together bends, or curves, the solar panel into a cylindrical arc shape that is stiffer in the out-of-plane direction than flat panels. When stowed, the curved panels may be stacked against each other to gain more stiffness. The solar array is stowed on the spacecraft with curved panels, with the flexible cross members and panels launched in a compressed, or pre-strained, condition. Upon release of the hold-downs restraining the solar array in its stowed configuration, the cross members and solar panels return to their un-strained, flat configuration. Structural integrity of the frame is mainly provided by the rigid frame members, while torsional rigidity is provided by flexible members connecting the two axial rigid members.

Figure 5A:
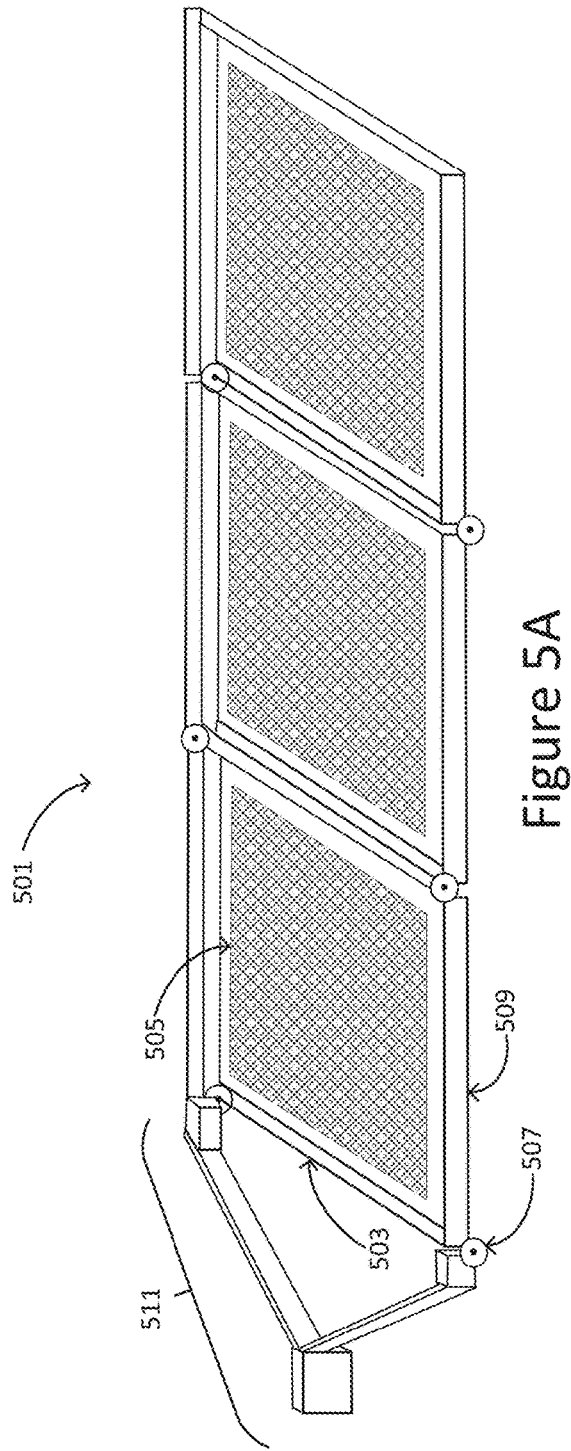
FIGS. 5A-5D illustrate an embodiment for a partially flexible solar array structure.

FIGS. 5A-5D illustrate one embodiment for a partially flexible solar array structure. FIG. 5A shows the solar array structure 501 in its deployed configured, where this can correspond to the deployed solar arrays 265 of FIGS. 3 and 4. The solar array structure 501 in this example is formed of three rectangular panels 505 of photovoltaic cells that connect to a spacecraft with a yoke structure 511. Other examples can have more or fewer than three panels 505 extending outward can also include additional panels 505 extending to the sides, such as illustrated below in FIG. 7. Although the rectangular panels 505 of FIGS. 5A-5D are represented as being roughly square in shape when flat, they can be of other aspect ratios. The panels 505 and their corresponding frames are connected to each other and to the yoke structure 511 by hinge lines 507 so that structure 501 can fold up when in the stowed position.

Figure 5B:
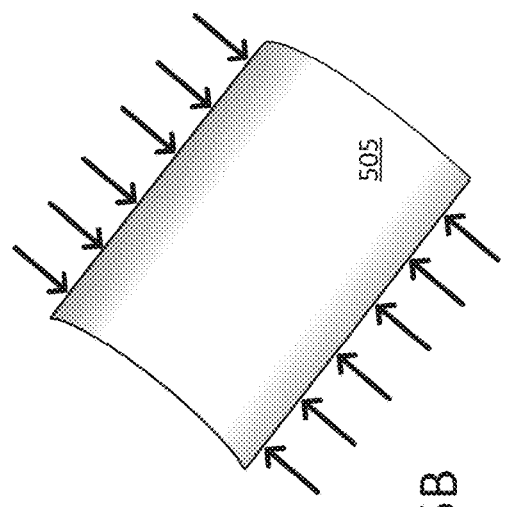

The solar panels 505 at least partially flexible, where they are thin and configured to flex to some degree in at least one direction when compressed from on pair of opposing sides, but have enough stiffness or resiliency so that they relax to be flat, or at least flatten, when in an uncompressed free state. This flexibility is represented schematically in FIG. 5B where, when pressure (represented by the arrows) is applied to opposing sides of panel 505, the panel will flex as shown by the shading. When the pressure is removed, the panel 505 will flatten out to its free state. This provides a flat surface for the deployed panels 505 that can then be oriented so that the incident sunlight is normal to the surface of the panel, maximizing efficiency, which is not the case a curve panel. When the panel 505 is curved as shown in FIG. 5B for the stowed position, this provides rigidity even for a relatively light flexible panel and, consequently, a light solar array structure 501.

Returning to FIG. 5A, each of the thin, flexible solar panels 505 are mounted in a structural frame that can still provide structural strength and stiffness when stowed during launch and when deployed for on-orbit operation. This is accomplished by keeping the main structure axially rigid against bending loads, and cross members semi-flexible in in-plane direction to allow axial members to be compressed to curve the solar panels 505. The embodiment of FIGS. 5A-5D uses a rectangular structural frame with two rigid axial sides 509 and two flexible cross members 503. The frame is flat with straight cross members 503 in its free state. The flexible members 503 bow outward (or inward) allowing rigid members 509 to get closer to each other when forced. A thin flat solar panel 505, or composite laminate skin, is flexibly attached to the opposing rigid sides 509 of the frame, but not the flexible sides 503. Forcing rigid sides 509 of the frame together bends, or curves, the solar panel 505 into a semi-cylindrical arc shape which is stiffer in out-of-plane direction than flat panels.

Figure 5C:
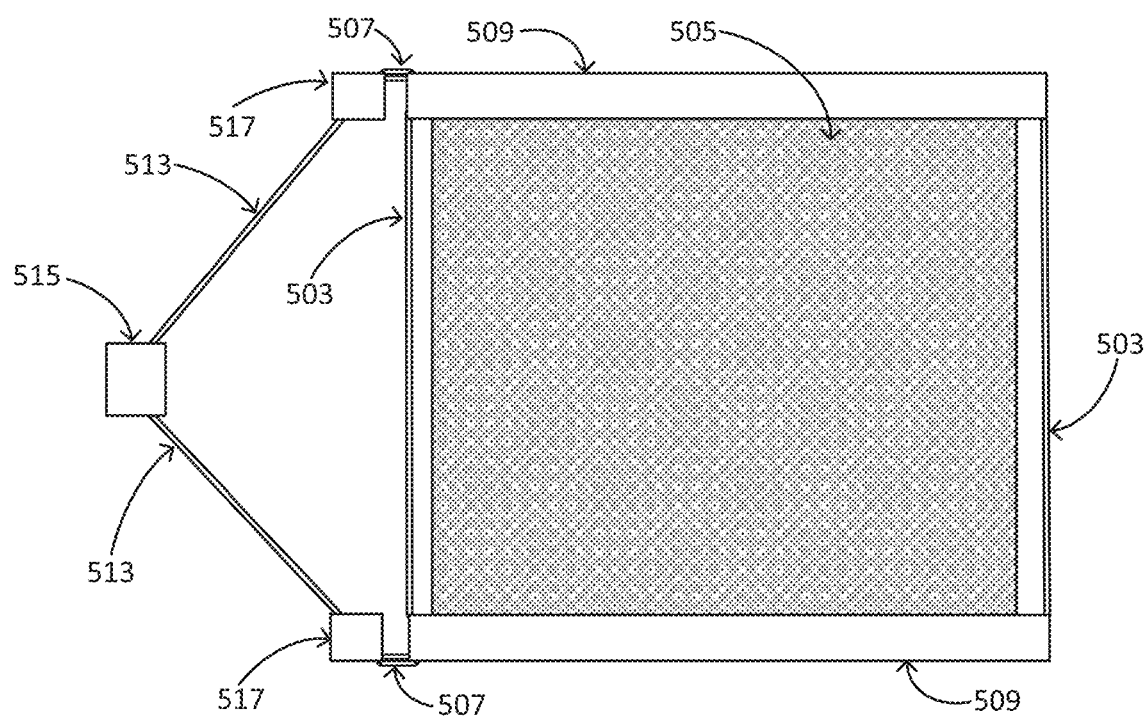
Figure 5D:
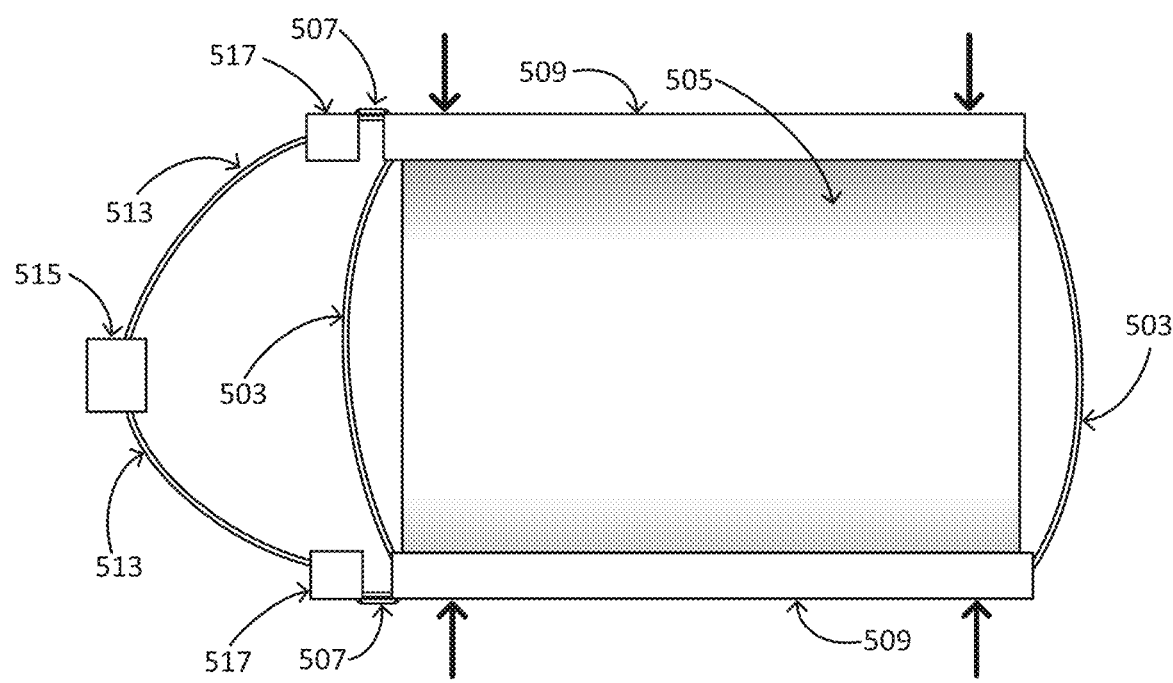

FIGS. 5C and 5D illustrate one of the panels and its frame from FIG. 5A connected to the yoke structure in the free flat state and in the curved state, respectively. As illustrated in FIG. 5C, in the free state the opposing flexible cross member sides 503 have a springiness that push apart the opposing rigid axial sides 509 to hold the solar panel 505 flat. The yoke structure includes a central portion 515 for connection to the spacecraft and end portions 517 that connect to the axial rigid sides 509 through the hinges 507. The central portion 515 of the yoke is connected to end portions 517 through yoke flex members 513. In the free state, the yoke flex members 513 are straight to also help the solar panel 505 stay flat.

FIG. 5D repeats the elements of FIG. 5C, but now with an applied inward force as represented by the arrows applied to the rigid axial members 509 to flex the solar panel 505. This causes the solar panel 505 to flex out of the plane. The compression also flexes the cross member sides 503 either outward (as shown in FIG. 5D) or inward and also flexes the yoke flex members 513. To stow the solar array structure, the opposing rigid axial members 509 are compressed toward each other into the configuration of FIG. 5D and hold-downs can be tensioned to hold the structure in the flexed configuration. To deploy the array structure 501, the hold-downs can then be released with the spring tension of the opposing flexible cross member sides 503 and yoke flex members 513, and also from the solar array panel 505 in some embodiments, straighten and flatten the solar array 505. The hinge lines 507 can also include a spring structure, such as a graphite or other spring structure, to fold out the array panels 505 as shown in FIG. 5A and also a mechanism, such as a mechanical or magnetic device, to latch the structure into its deployed configuration of FIG. 5A. Other embodiments can alternately or additionally incorporate a motor for folding out of the panels into the deployed configuration.

The curved solar array panels 505 can be stacked against each other to gain more stiffness when stowed. The solar array 501 is stowed on the spacecraft with curved solar panels 505, and with the flexible cross members 503 and solar array panels 505, and launched in this pre-strained condition. Upon release of hold-downs, the cross members 503 and solar panels 505 return to their pre-strained flat configuration. Structural integrity of the frame is mainly provided by the axial members 509, while torsional rigidity is provided by flexible cross members 503 connecting the two axial rigid members 509.

Depending on the embodiment, the components for solar array structure 501 can be made of a number of different materials. For example, the solar array panels 505 can be formed of a thin layer of graphite, on the order 10 or a few 10s of mils thick, with photovoltaic cells on the top surface, where these could be cooked on to laminate them on the surface or glued on. As the frame provides rigidity and holds the panel 505 flat when deployed, the panel does not need to provide the sort of structural rigidity that would otherwise be needed, leading to a lightweight solar array panel 505. In some embodiments the solar array panels 505 could include ribs or other preloading structure on the backside. Embodiments for the frame's rigid members 509, and the central portion 515 and outer portions 517 of the yoke can, for example, be made of hollow graphite rectangular tubes or I-beams with dimensions on the order or a few inches, of fraction of an inch, and a wall thickness of 10s of mils. The flexible side members 503 and the yoke's flex members 513 can be a strip of graphite of a few millimeters thickness, for example, that is configured to bend in one direction for the stowed configuration and provide springiness to open the structure out into its deployed configuration. As illustrated by FIGS. 5C and 5D, the frame can provide the panel 505 with the skin stretching springiness to help straighten panels 505 to the flat shape from the stowed concave shape into which they can be forced to compress them for launch.

Figure 6A:
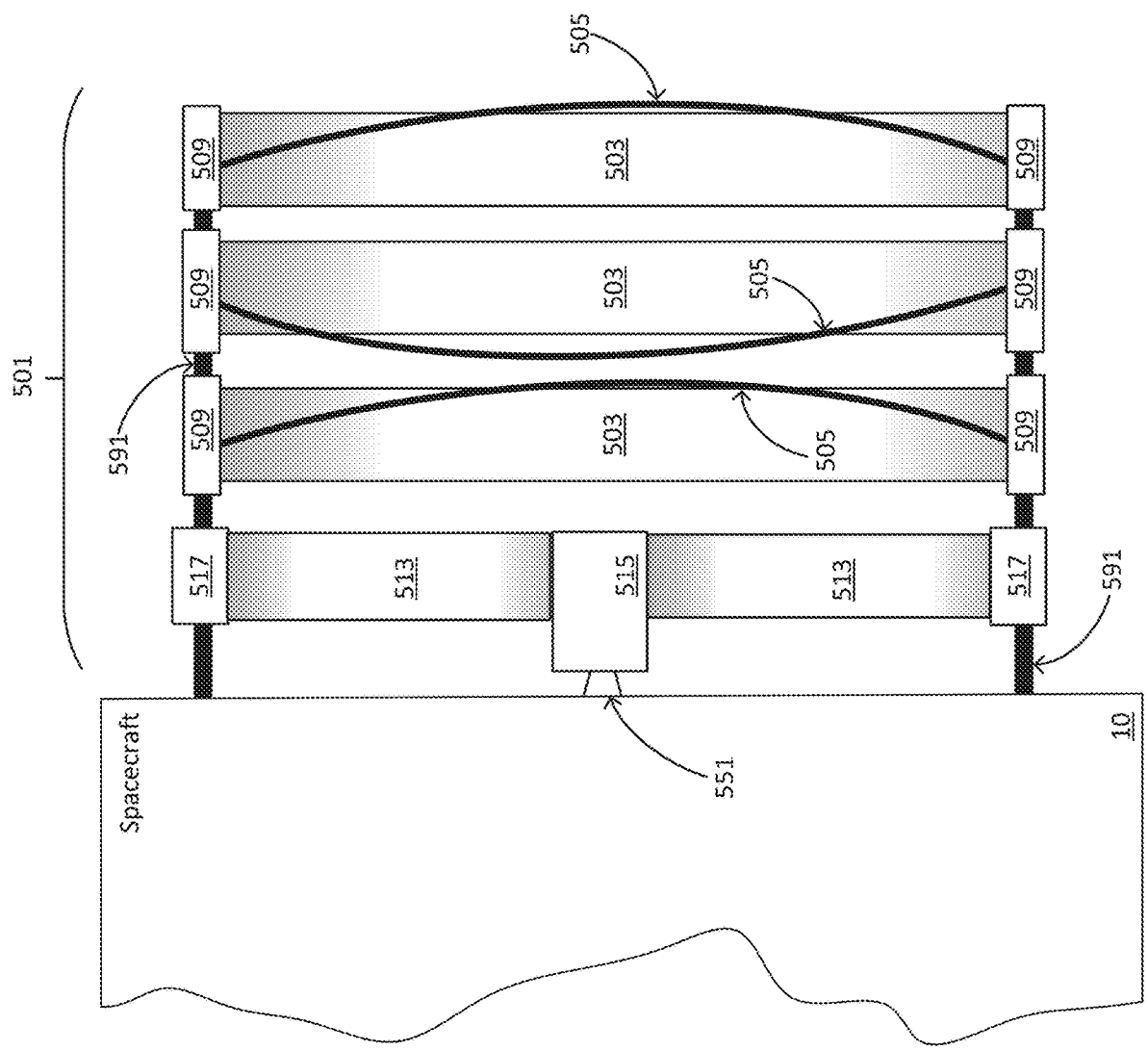
FIGS. 6A and 6B respectively show a top view and a front view of the solar array structure of FIGS. 5A-5D as mounted in a stowed configuration on a spacecraft.
Figure 6B:
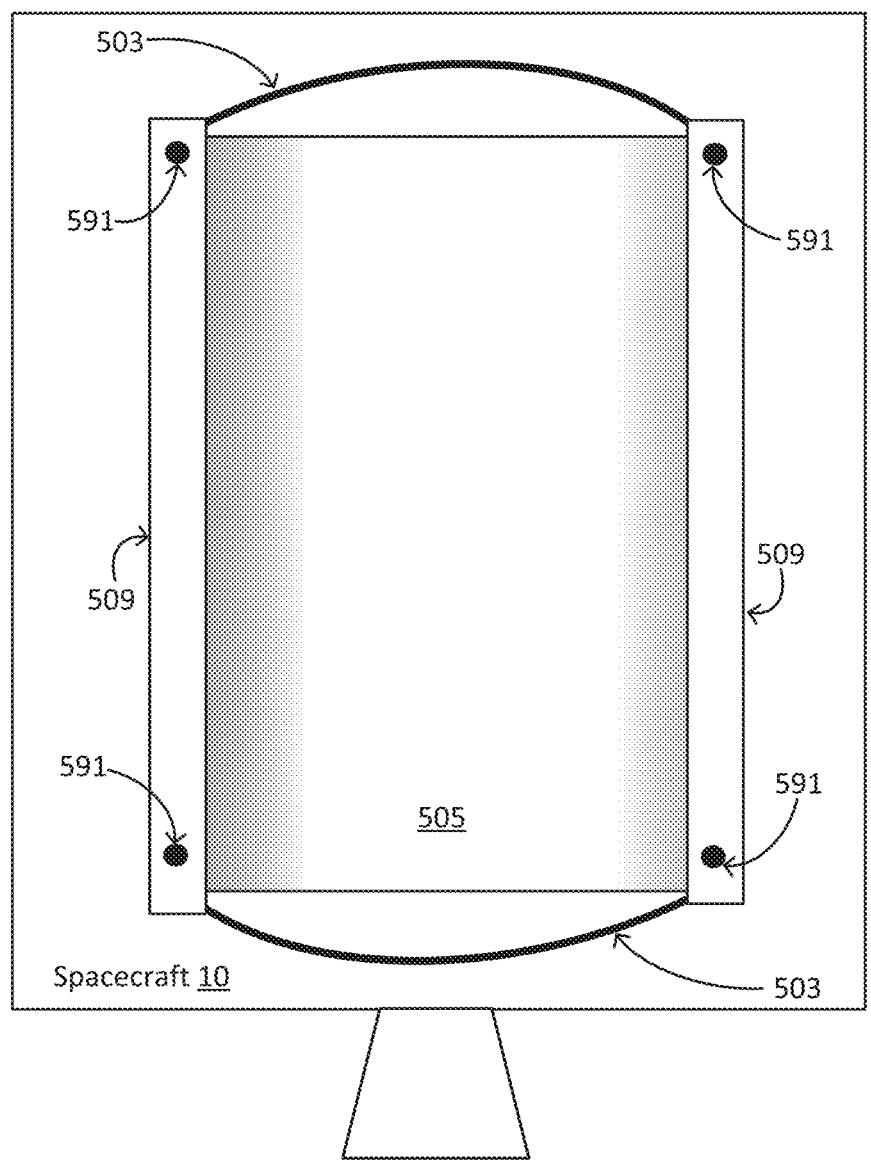

FIGS. 6A and 6B respectively show a top view and a front view of the solar array structure 501 as mounted in a stowed configuration on a spacecraft 10. FIG. 6A shows a portion of the top surface of the spacecraft 10 looking down on the array structure in its folded and compressed stowed form as mounted onto the spacecraft's side. The yoke's central portion 515 connects to the spacecraft's solar array drive assembly (such as incorporated into the mount 551), which the spacecraft 10 can use to rotate the deployed solar array structure to face the sun. The yoke's flex members 513, that connect the central portion 515 to the outer portions 517 of the yoke, are flexed as illustrated in FIG. 5D, but the bowing is not visible from this view and is instead indicated through shading. The yoke end portions 517 are then connected through the hinges (507 in FIGS. 5A, 5C, and 5D, but not shown in FIGS. 6A and 6B as obscured by hold-downs 591) to the axial members 509 of the inner-most panel 505 on one end (e.g., into the page). The axial members 509 of the closest panel 505 are then connected on the other end (e.g., out of the page) to the axial members 509 of the middle panel 505, which is then similarly connected on to the axial members 509 of the outer-most panel 505. The (in this example) three solar array panels 505 are stacked together bowed in alternating directions. The flexible cross member 503 on the into the page end of the rigid axial members 509 bow into or out of the page, so that their flexing is again represented by shading. The flexible cross member 503 on the out of the page end of the rigid axial members 509 are not shown in FIG. 6A as they would largely obscure the solar panels.

A hold down 591 runs through the rigid axial members 509 on either end to both hold the solar array structure folded against the spacecraft 10 and to also hold it compressed into the flexed position. In the shown embodiment, the hold-downs 591 are pins or rods that extend from the body of spacecraft 10 through the edges of rigid frame members 509 to hold the solar array structure in its compressed stowed configuration. The hold-downs 591 can then be released by an electric signal and the structure can then unfold and flatten, where this can be in response to a control signal from a ground control terminal 30 or be generated by control circuits on the spacecraft 10. A number of embodiments for the hold-downs are possible, with the shown hold-downs 591 just one example.

FIG. 6B is a sideview of the solar array structure 501 in a stowed configured attached onto the side of the body of spacecraft 10. Only the outer-most solar array panel 505 and its frame members 503 and 509 are visible, with the other panels and respective frames and the yoke folded behind. The two flexible cross members 503 are flexed, extending (in this example) away from the solar array panel 505. The ends of the hold-downs 591 can be seen on the rigid axial members 509.

Figure 7:
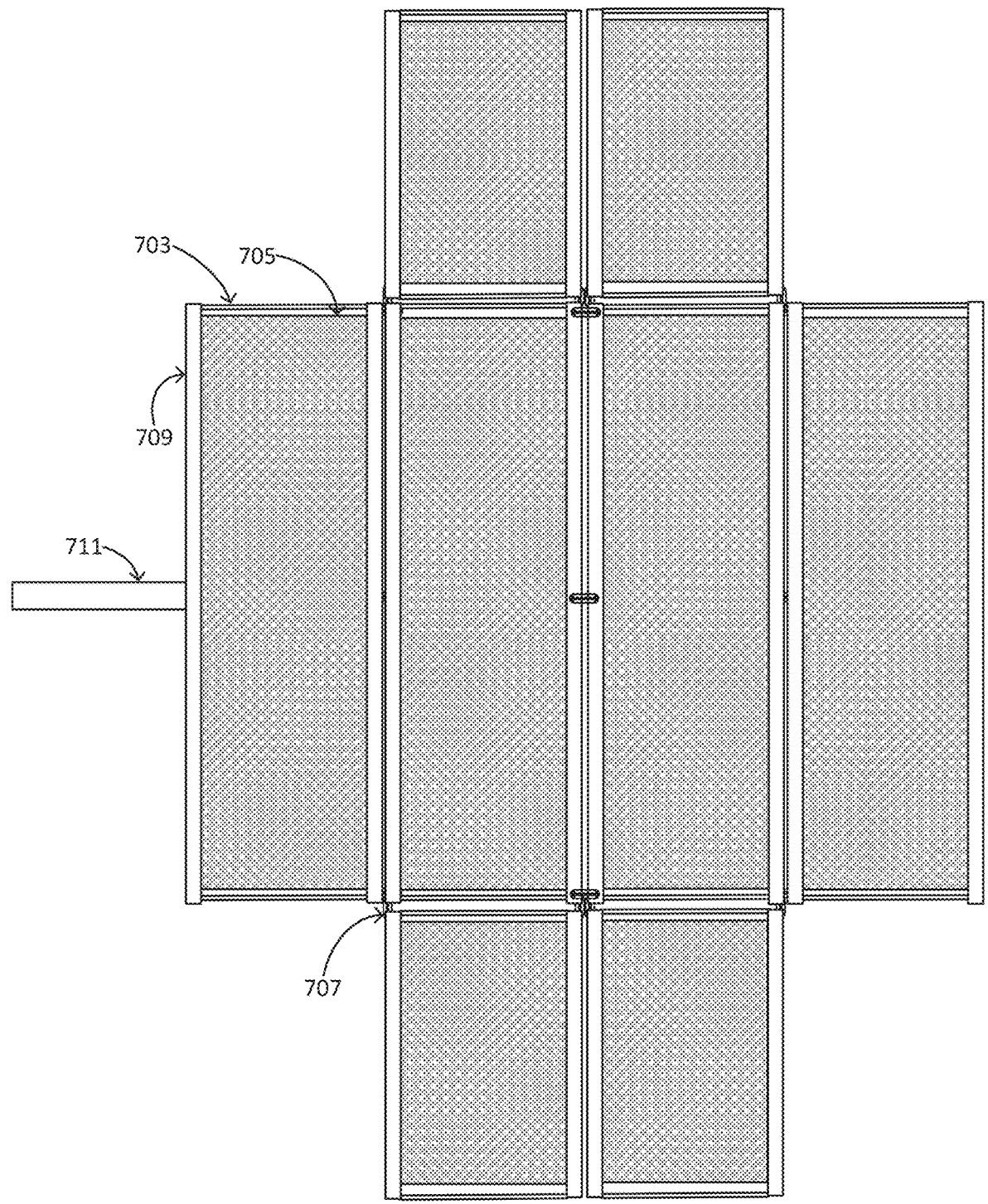
FIG. 7 shows an alternate embodiment in its deployed state.

The embodiment of FIGS. 5A-6B has three solar panels 505 with corresponding frames in which the rigid members 509 extending axially (when deployed), with the flexible cross members 503 running between the rigid members 509, but a number of alternate embodiments are possible. For example, the solar array structure can extent for fewer or more than the three panel version of the solar array structure 501, and additional panels can also extend sideways. The panels 505 of FIGS. 5A-6B have, when flat, a roughly square shape, but other shapes can be used. The number and arrangement of panels can be based on the power requirements of the spacecraft and the form factor into which it is to fold for its stowed configuration. Additionally, depending on structural loads and flex requirements, the orientation of the opposing rigid sides of the frames relative to the flex sides can be switched so that, when viewed in the deployed configuration, rather than compress laterally (i.e., sideways relative to the extension direction) as in FIGS. 5A-5D, the flexible panels and frame members can compress in the axial direction. FIG. 7 illustrates some of these variations.

FIG. 7 shows an alternate embodiment for a solar array structure when in its deployed state. This embodiment has eight foldable sections mounted to a yoke 711 for mounting to a spacecraft, where the section nearest to the spaceship is shown with reference numbers. Four larger rectangular sections extend in the outward, or axial, direction along their thinner axis, with a pair of shorter sections extending off from the central portion to the sides. The flexible solar array panel 705 is in a frame of rigid members 709 along one set of opposing sides and flexible members 703 along the other pair of opposing sides. In the embodiment of FIG. 7 the flexible members 703 now extend axially so that, when compressed, the solar array panel 705 will be flexed in the left to right (as seen in the figure) direction. In this orientation, the yoke 711 can attach onto the array structure on the backside and need not include flexible members itself. The solar array structure also includes hinge structures, such as the one indicated at 707, so that the panels can be folded up into the stowed configuration, where depending on the embodiment, the panels can be folded in various arrangements and then compressed to form compact package.

Figure 8:
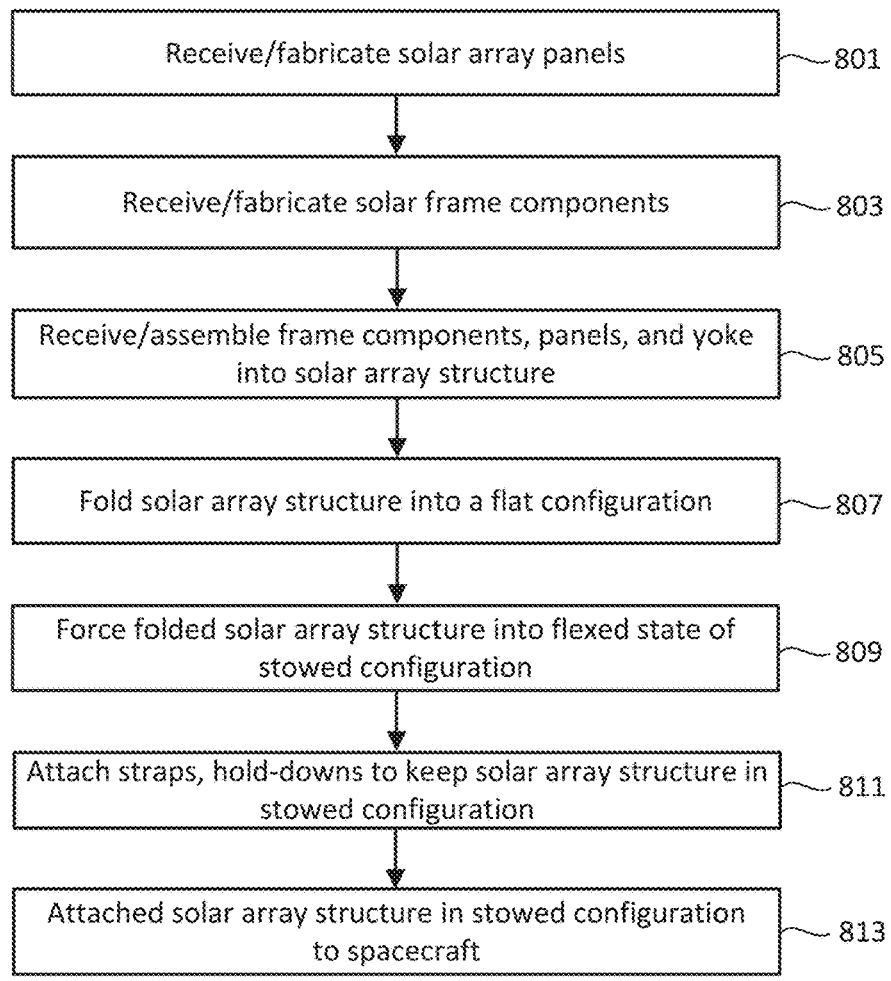
FIGS. 8 and 9 are flowcharts respectively describing embodiments for the stowing and the deploying of the partially flexible solar array structures.
Figure 9:
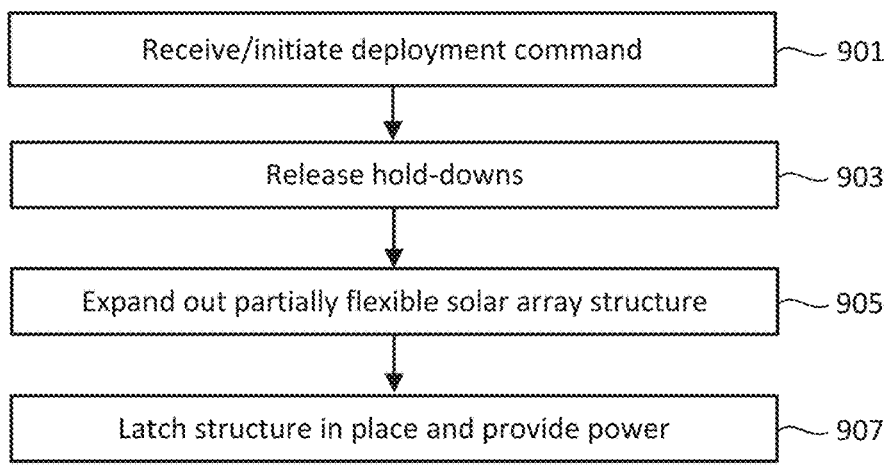

FIGS. 8 and 9 are flowcharts respectively describing embodiments for the stowing and the deploying of the partially flexible solar array structures. FIG. 8 begins at step 801 with receiving or fabricating the flexible solar array panels (505/705) and, at step 803, with receiving or fabricating the frame structures of the opposing rigid frame members (509/709) for one set of opposing sides and flexible members (503/703) for the other opposing sides, where these two steps can occur in either order or concurrently. These components, along with the yoke structure (511/711) and the hinges (507/707) can then be assembled or, if assembled elsewhere, received at step 805. The assembled structure is then folded along its hinges (507/707) into a flat configuration at step 807. The folded structure is then forced at step 809 by compressing together the rigid frame members (509/709) to pre-stress the flexible members (503/703, 513) and solar array panels (505/705) into the partially flexed condition in which the structure will be stowed in step 811. Once in the partially flexed stowed configuration, straps or hold-downs (such as 591) can then be attached at step 811 to form a compact package, which can then be attached to the spacecraft 10 at step 813 by connecting the yoke structure (511/711) to the mount (551) and attach the hold-downs (591) to the body of the spacecraft 10. In some embodiments, the solar array structure can be attached to the spacecraft first, and then folded and compressed into the partially flexed configuration and have hold-downs attached subsequently.

FIG. 9 is a flowchart of an embodiment of the deployment process and begins once the spacecraft has been launched. Starting at step 901, the control circuits on the spacecraft, such as the command and data handling sub-system (C&DH) 210, initiates a deployment command. This command can be received from a ground station or originate on the spacecraft itself, such as in response to a specified set of conditions. At step 903 the hold-downs (591) are released, such as by pulling out of a pin by a servo or actuator. Once released, at step 905 the solar array structure can begin to fold out from its stowed configuration of FIGS. 6A and 6B to its deployed configuration of FIG. 5A or 7, expanding by rotating about the hinges (507/707). The rotation can be effected by use of graphite or other spring structures incorporated into the structure of the hinges (507/707), other automatic device, or could incorporate a motor. The frames are then latched into place at step 907, such as by mechanical or magnetic latches, where these could be incorporated into the hinges (507/707), separate latches, or a combination of these, and the solar array structure can provide power to the spacecraft.

One embodiment includes an apparatus comprising: one or more solar array panels configured to flex when compressed in a first direction; and a corresponding frame structure for each of the one of the one or more solar array panels. Each of the frame structures includes: an opposing pair of rigid frame members each connected to a corresponding side of the corresponding solar array panel; and an opposing pair of flexible frame members connected between the opposing pair of rigid frame members. The opposing pair of flexible frame members are configured to: flex when the opposing pair of rigid frame members are compressed in the first direction to flex the corresponding solar array panel, and extend to flatten the corresponding solar array panel when the opposing pair of rigid frame members are not compressed in the first direction.

In other embodiments, a method includes folding a solar array structure into a flat configuration, where the solar array structure includes one or more solar array panels, each with a corresponding frame, and a yoke configured to connect the one or more solar array panels and corresponding one or more frames to a spacecraft. The method also includes compressing the one or more solar array panels of the folded solar array structure into a flexed configuration, wherein each of the frames includes an opposing pair of rigid frame members connected to a corresponding side of the corresponding solar array panel and an opposing pair of flexible frame members connected in a first direction between the opposing pair of rigid frame members. Compressing the one or more solar array panels into the flexed configuration includes forcing the one or more opposing pairs of rigid frame members towards one another in the first direction.

One embodiment includes a spacecraft having a spacecraft body and a solar array structure attached to the spacecraft body. The solar array structure has a stowed configuration and a deployed configuration and includes: one or more solar array panels and a corresponding frame structure for each of the one or more solar array panels. In the stowed configuration, the solar array panels are flexed in a first direction and, in the deployed configuration, the solar array panels are flattened in the first direction.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of be defined by the claims appended hereto.

What is claimed is:

1. An apparatus, comprising:
   a plurality of rectangular rigid solar array panels configured to partially flex when compressed in a first direction and to flatten when not compressed in the first direction; and
   a corresponding rectangular frame structure for each of the plurality of solar array panels, each frame structure including:
   an opposing pair of rigid frame members each connected to a corresponding side of the corresponding solar array panel; and
   an opposing pair of flexible frame members running in the first direction and connected between the opposing pair of rigid frame members and configured to:
   flex when the opposing pair of rigid frame members are compressed in the first direction to flex the corresponding solar array panel, and
   extend to flatten the corresponding solar array panel when the opposing pair of rigid frame members are not compressed in the first direction.

2. The apparatus of claim 1, further comprising:
   a yoke having a first end configured to connect to a spacecraft; and
   a plurality of hinges connecting a second end of yoke and the corresponding frame structures of solar array panels, the plurality of hinges configured to:
   fold the yoke and the one or more solar array panels and corresponding frame structures into a stowed configuration in which one or more solar array panels and the corresponding opposing frame members compressed in the first direction to flex the one or more solar array panels; and
   extend the yoke and the one or more solar array panels and corresponding frame structures into a deployed configuration in which one or more solar panels are flattened.

3. The apparatus of claim 2, further comprising:
   one or more hold-downs configured to:
   hold the apparatus in the stowed configuration when in place; and
   allow the apparatus to extend in to the deployed configuration when released.

4. The apparatus of claim 2, wherein the hinges are further configured to:
   unfold yoke and the plurality of solar array panels and corresponding frame structures into the deployed configuration.

5. The apparatus of claim 2, wherein the plurality of solar array panels include a first plurality of solar array panels and wherein, when in the deployed configuration, the first plurality solar array panels and corresponding frame structures extend axially away a spacecraft to which the yoke is connected.

6. The apparatus of claim 2, wherein, when in the deployed configuration, one or more of the plurality of the solar array panels and corresponding frame structures extend axially away from the spacecraft to which the yoke is connected and one or more of the plurality solar array panels and corresponding frame structures extend sideways from the plurality of solar array panels and corresponding frame structures extending axially.

7. The apparatus of claim 2, wherein, when in the deployed configuration, the first direction is an axial direction relative to a spacecraft to which the yoke is connected.

8. The apparatus of claim 2, wherein, when in the deployed configuration, the first direction is a lateral direction relative to a spacecraft to which the yoke is connected.

9. The apparatus of claim 8, wherein the yoke comprises:
a rigid central section at the first end of the yoke by which the yoke is configured to connect to the spacecraft;
a first rigid end section configured to connect by a first hinge to a first rigid frame member corresponding to a first of the plurality of solar array panels;
a second rigid end section configured to connect by a second hinge to a second rigid frame member corresponding to the first of the plurality of solar array panels;
a first flexible member connecting the rigid central section to the first rigid end section; and
a second flexible member connecting the rigid central section to the second rigid end section.

10. The apparatus of claim 2, further comprising:
a plurality of latches connected to the yoke and the frame structures of the solar array panels and configured to maintain the yoke and the frame structures of the solar array panels in the deployed configuration.

11. A method, comprising:
folding a solar array structure into a flat configuration, the solar array structure including:
a plurality of rectangular rigid solar array panels configured to partially flex when compressed in a first direction and to flatten when not compressed in the first direction, each solar panel having a corresponding rectangular frame structure; and
a yoke configured to connect the solar array panels and the corresponding frame structures to a spacecraft; and
prior to attaching the solar array structure to the spacecraft, compressing the one or more solar array panels of the folded solar array structure into a flexed configuration, wherein each of the rectangular frame frames includes an opposing pair of rigid frame members connected to a corresponding side of the corresponding solar array panel and an opposing pair of flexible frame members connected in a first direction between the opposing pair of rigid frame members, where compressing the one or more solar array panels into the flexed configuration includes:
forcing the one or more opposing pairs of rigid frame members towards one another in the first direction.

12. The method of claim 11, further comprising:
subsequent to compressing the one or more solar array panels into a flexed configuration, attaching one or more hold-downs to maintain the solar array structure in the flexed configuration.

13. The method of claim 12, further comprising:
attaching the yoke to a spacecraft.

14. The method of claim 13, further comprising:
subsequent to attaching the yoke to the spacecraft, releasing the one or more hold-downs to thereby expand the solar array structure into a deployed configuration.

15. The method of claim 14, further comprising:
subsequent to expanding the solar array structure into a deployed configuration, providing power from the solar array structure to the spacecraft.

16. A spacecraft, comprising:
a spacecraft body; and
a solar array structure attached to the spacecraft body, the solar array structure having a stowed configuration and a deployed configuration, the solar array structure including:
a plurality of rectangular rigid solar array panels configured to partially flex when compressed in a first direction and to flatten when not compressed in the first direction; and
a corresponding rectangular frame structure for each of the solar array panels, where, in the stowed configuration, the solar array panels and corresponding frame structures are flexed in the first direction and, in the deployed configuration, the solar array panels and corresponding frame structures are flattened in the first direction.

17. The spacecraft of claim 16, the solar array structure further including:
one or more hold-downs configured to:
maintain the solar array structure in the stowed configuration when in place; and
release to let the solar array structure expand into the deployed configuration.

18. The spacecraft of claim 17, the solar array structure further including:
a yoke connecting the solar array structure to the spacecraft; and
a plurality of hinges connecting the yoke and the one or more frame structures, the hinges configured to expand the solar array structure from the stowed configuration to the deployed configuration in response to the release of the one or more hold-downs.

19. The spacecraft of claim 17, wherein each of the corresponding frame structures comprises:
an opposing pair of rigid frame members each connected to a corresponding side of the corresponding solar array panel; and
an opposing pair of flexible frame members running in the first direction and connected between the opposing pair of rigid frame members and configured to:
flex when the opposing pair of rigid frame members are compressed in the first direction to flex the corresponding solar array panel when in the stowed configuration; and
extend to flatten the corresponding solar array panel in response to the release of the one or more hold-downs.

20. The spacecraft of claim 17, the spacecraft further comprising:
one or more control circuits configured to release the hold-downs in response to a received command.

* * * * *

UNITED STATES PATENT AND TRADEMARK OFFICE
CERTIFICATE OF CORRECTION

| | | |
|---|---|---|
| PATENT NO. | : 11,912,440 B2 | |
| APPLICATION NO. | : 17/463670 | |
| DATED | : February 27, 2024 | |
| INVENTOR(S) | : Baghdasarian | |

It is certified that error appears in the above-identified patent and that said Letters Patent is hereby corrected as shown below:

In the Claims

Column 11, Line 11, (Claim 6): After "plurality" and before "solar" insert -- of --.

Column 11, Lines 54-55, (Claim 11): After "wherein" and before "includes" delete "each of the rectangular frame frames" and replace with -- each rectangular frame --.

Signed and Sealed this
Ninth Day of April, 2024

*Katherine Kelly Vidal*

Katherine Kelly Vidal
*Director of the United States Patent and Trademark Office*